United States Patent [19]

Mori

[11] Patent Number: 5,198,804
[45] Date of Patent: Mar. 30, 1993

[54] VIDEO MEMORY WITH WRITE MASK FROM VECTOR OR DIRECT INPUT

[75] Inventor: Toshiki Mori, Osaka, Japan

[73] Assignee: Matsushita Electric Industrial Co., Ltd., Osaka, Japan

[21] Appl. No.: 545,782

[22] Filed: Jun. 29, 1990

[30] Foreign Application Priority Data

Jul. 17, 1989 [JP] Japan .................................. 1-184086

[51] Int. Cl.⁵ .......................................... G09G 1/02
[52] U.S. Cl. ...................................... 340/799; 340/750
[58] Field of Search ............... 340/750, 799, 723, 721; 365/189.01, 189.02

[56] References Cited

U.S. PATENT DOCUMENTS

| | | | |
|---|---|---|---|
| 4,689,741 | 8/1987 | Redwine et al. | 340/799 |
| 4,757,473 | 7/1988 | Kurihara et al. | |
| 4,773,026 | 9/1988 | Takahara et al. | 340/799 |
| 4,802,118 | 1/1989 | Honda et al. | 340/799 |
| 4,862,150 | 8/1989 | Katsura et al. | 340/799 |
| 4,876,663 | 10/1989 | McCord | 340/799 |
| 4,920,504 | 4/1990 | Sawada et al. | 340/750 |
| 4,943,801 | 7/1990 | Oguchi | 340/799 |

OTHER PUBLICATIONS

Pinkham et al., "A 128K×8 70MHz Video RAM with Auto Register Reload", IEEE Solid-State Circuits Conference, Feb. 17-19, 1988, New York, U.S.A., pp. 236, 237, and 384.

Primary Examiner—Ulysses Weldon
Assistant Examiner—M. Fatahiyar
Attorney, Agent, or Firm—Lowe, Price, LeBlanc & Becker

[57] ABSTRACT

A video memory includes a data storage section having a predetermined bit width of data writing and reading. A data input terminal has a predetermined bit width and is subjected to input data which represents at least a write start position and a write end position. Mask data are generated on the basis of the write start position and the write end position represented by input data. The mask data are fed to the data storage section. Write data are generated. The write data are fed to the data storage section. The bit width of data writing and reading of the data storage section is greater than the bit width of the data input terminal.

18 Claims, 12 Drawing Sheets

FIG. 5

(a) INPUT DATA (WRITE DATA)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
|   | 1 |   |   | 4 |   |   |   |   |   |    |    | 28 |    |    |    |

WRITE START POSITION: 4
WRITE END POSITION: 28

(b) WRITE START MASK

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|
| 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

(c) WRITE END MASK

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 |

(d) WRITE MASK

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|
| 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 |

(e) WRITE DATA

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

(f) DRAWING DATA

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|
| x | x | x | x | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | x | x | x |

A (region from bit 4 to bit 28)

FIG. 6

(a) INPUT DATA, (b) INPUT DATA, (c) WRITE MASK, (d) WRITE DATA, (e) DRAWING DATA

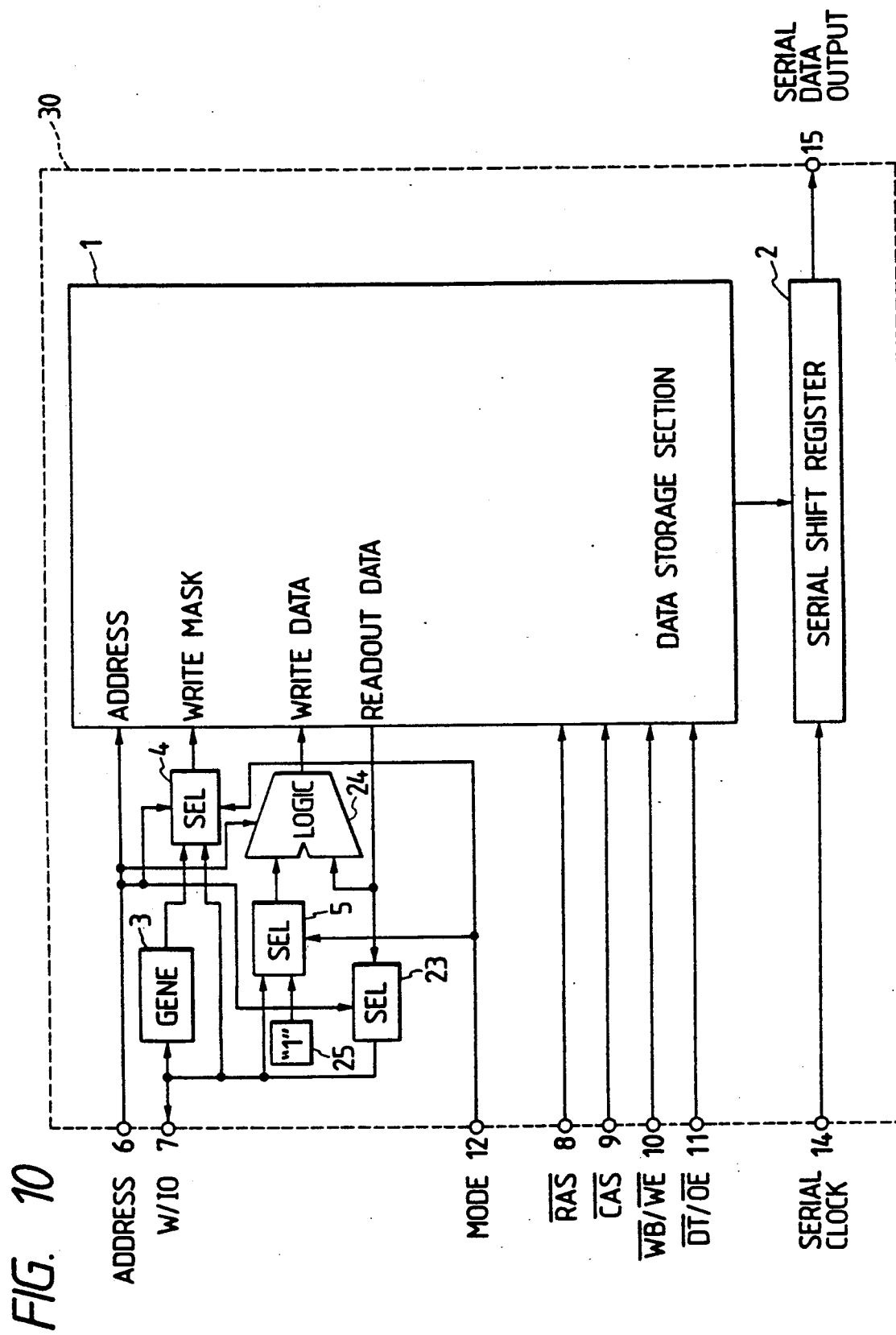

VIDEO MEMORY WITH WRITE MASK FROM VECTOR OR DIRECT INPUT

BACKGROUND OF THE INVENTION

This invention relates to a video memory usable in various systems such as graphics and character display systems.

In some display systems, video data representing graphics or character information are indicated on a CRT. Such a display system has a video memory for storing video data. In general, the video memory used in such a display system is of a dual-port type having a random port and a serial port. The random port is used to draw the video data while the serial port is used for the readout of data indicated on the CRT.

In prior art video memories of the dual-port type, the bit width of a data input/output terminal in the random port is considerably limited. Generally, the bit width of the data input/output terminal corresponds to 4 bits to 8 bits. The limited bit width tends to cause an insufficient speed of the data drawing.

SUMMARY OF THE INVENTION

It is an object of this invention to provide an excellent video memory.

According to a first aspect of this invention, a video memory comprises a data storage section having a predetermined bit width of data writing and reading; a data input terminal having a predetermined bit width and being subjected to input data which represents a start position and a write end position; means for generating mask data on the basis of the write start position represented by the input data and the write end position, and for feeding the mask data to the data storage section; and means for generating write data on the basis of at least part of an input signal, and for feeding the write data to the data storage section; wherein the bit width of data writing and reading of the data storage section is greater than the bit width of the data input terminal.

According to a second aspect of this invention, a video memory comprises a data storage section having a predetermined bit width of data writing and reading; a data input terminal having a predetermined bit width and being subjected to input data which represents a write start position, a write end position, primary mask data, and primary write data; means for generating first mask data on the basis of the write start position represented by the input data and the write end position; means for generating second mask data on the basis of the primary mask data represented by the input data; first selecting means for selecting one of the first mask data and the second mask data, and for feeding the selected one of the first mask data and the second mask data to the data storage section; means for generating first write data on the basis of a part of the input data; means for generating second write data on the basis of the primary write data represented by the input data; and second selecting means for selecting one of the first write data and the second write data, and for feeding the selected one of the first write data and the second write data to the data storage section; wherein the bit width of data writing and reading of the data storage section is greater than the bit width of the data input terminal.

According to a third aspect of this invention, a video memory comprises a data storage section having a predetermined bit width of data writing and reading; a data input terminal having a predetermined bit width and being subjected to input data which represents a write start position, a write end position, primary mask data, and primary write data; means for generating first mask data on the basis of the write start position represented by the input data and the write end position; means for generating second mask data on the basis of the primary mask data represented by the input data; first selecting means for selecting one of the first mask data and the second mask data, and for feeding the selected one of the first mask data and the second mask data to the data storage section; means for generating first write data on the basis of a content of a predetermined bit of the input data; means for generating second write data on the basis of the primary write data represented by the input data; and second selecting means for selecting one of the first write data and the second write data, and for feeding the selected one of the first write data and the second write data to the data storage section; wherein the bit width of data writing and reading of the data storage section is greater than the bit width of the data input terminal.

According to a fourth aspect of this invention, a video memory comprises a data storage section having a predetermined bit width of data writing and reading; a data input terminal having a predetermined bit width and being subjected to input data which represents a write start position, a write end position, primary mask data, and primary write data; means for generating first mask data on the basis of the write start position represented by the input data and the write end position; means for generating second mask data on the basis of primary mask data represented by the input data; first selecting means for selecting one of the first mask data and the second mask data, and for feeding the selected one of the first mask data and the second mask data to the data storage section; means for generating first write data on the basis of a content of a predetermined bit of an address signal; means for generating second write data on the basis of the primary write data represented by the input data; and second selecting means for selecting one of the first write data and the second write data, and for feeding the selected one of the first write data and the second write data to the data storage section; wherein the bit width of data writing and reading of the data storage section is greater than the bit width of the data input terminal.

According to a fifth aspect of this invention, a video memory comprises a data storage section having a predetermined bit width of data writing and reading; a data input terminal having a predetermined bit width and being subjected to input data which represents a write start position, a write end position, primary mask data, and primary write data; means for generating first mask data on the basis of the write start position represented by the input data and the write end position; means for generating second mask data on the basis of the primary mask data represented by the input data; first selecting means for selecting one of the first mask data and the second mask data, and for feeding the selected one of the first mask data and the second mask data to the data storage section; means for generating first write data; means for generating second write data on the basis of the primary write data represented by the input data; and second selecting means for selecting one of the first write data and the second write data, and for feeding the selected one of the first write data and the second write data to the data storage section; wherein the bit width of data writing and reading of the data storage section is greater than the bit width of the data input terminal.

According to a sixth aspect of this invention, a video memory comprises a data storage section having a predetermined bit width of data writing and reading; a data input terminal having a predetermined bit width and being subjected to input data which represents a write start position, a write end position, primary mask data, and primary write data; means for generating first mask data on the basis of the write start position represented by the input data and the write end position; means for generating second mask data on the basis of the primary mask data represented by the input data; first selecting means for selecting one of the first mask data and the second mask data, and for feeding the selected one of the first mask data and the second mask data to the data storage section; means for generating first write data; means for generating second write data on the basis of the primary write data represented by the input data; second selecting means for selecting one of the first write data and the second write data, and for outputting the selected one of the first write data and the second write data; and means for executing a logic operation between the output data from the second selecting means and data read out from the data storage section, for generating third write data corresponding to a resultant of the logic operation, and for feeding the third write data to the data storage section; wherein the bit width of data writing and reading of the data storage section is greater than the bit width of the data input terminal.

BRIEF DESCRIPTION OF THE DRAWINGS

FIGS. 5a-f is a diagram showing the contents of various data which occur during a vector mode of operation of the video memory of FIG. 1.

FIGS. 6a-e is a diagram showing the contents of various data which occur during an image mode of operation of the video memory of FIG. 1.

FIG. 10 is a block diagram of a video memory according to a third embodiment of this invention.

The same reference characters denote corresponding or like elements throughout the drawings.

DESCRIPTION OF THE FIRST PREFERRED EMBODIMENT

Figure 1:
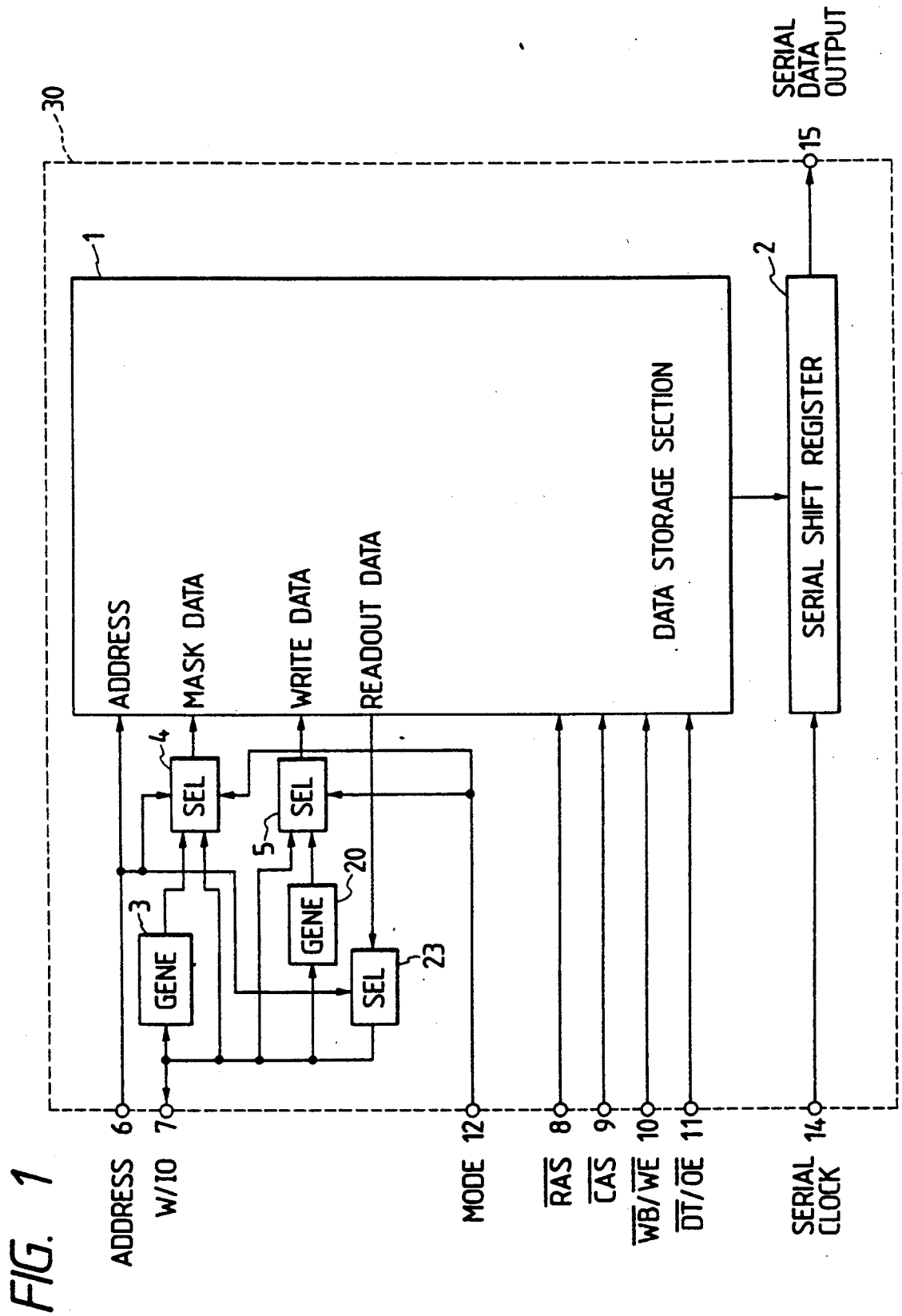
FIG. 1 is a block diagram of a video memory according to a first embodiment of this invention.

With reference to FIG. 1, a video memory 30 of a dual-port type has a data storage section 1 for storing video data corresponding to a display picture. The data storage section 1 includes an array of memory cells. Video data having a parallel form with a predetermined number of bits (for example, 32 bits) are written into or read out from the data storage section 1. In other words, the data storage section 1 has a predetermined bit width of data writing and reading. In general, the video data represent graphics and character information. A serial shift register 2 connected to the data storage section 1 is used for the serial readout of the video data.

During a process of drawing video data in the data storage section 1, video data having a parallel form are written into the data storage section 1 via a random port which will be explained later. During a process of indicating the video data on a CRT (not shown), the video data corresponding to one line or row are transferred from the data storage section 1 to the serial shift register 2, and the transferred data are serially read out from the serial shift register 2 and are fed to the CRT.

The one-line amount of the video data can be read out from the data storage section 1 by each access to the data storage section 1 via the random port. Thus, the reading of the video data from the data storage section 1 is enabled by a reduced number of times of the execution of the access to the data storage section 1 so that the writing of the video data into the storage section 1 can spend a longer time. This allows an increase in the speed of drawing the video data in the data storage section 1.

The random port includes an input terminal 6 for an address signal, an input/output (I/O) terminal 7 for mask data and video data, an input terminal 8 for a RAS (row address strobe) signal, an input terminal 9 for a CAS (column address strobe) signal, an input terminal 10 for a write mask control signal and a write enable (WE) signal, and an input terminal 11 for a serial data transfer (DT) control signal and an output enable (OE) signal. The terminals 6, 8, 9, 10, and 11 are directly connected to the data storage section 1. During the writing of video data into the data storage section 1, mask data and video data having a parallel form with a predetermined number of bits (for example, 16 bits) are inputted via the input/output terminal 7. During the reading of the video data from the data storage section 1, the readout video data having a parallel form can be outputted via the input/output terminal 7. The input/output terminal 7 has a predetermined number (for example, 16) of divided segments which correspond to respective bits of the input or output data. In other words, the input/output terminal 7 has a predetermined bit width. The bit width of the input/output terminal 7 is chosen to be smaller than the bit width of the data writing and reading of the data storage section 1. The RAS signal is used to perform the control of a timing at which a row address is given. The CAS signal is used to perform the control of a timing at which a column address is given. The write mask control signal is used in the control for enabling and disabling the mask data. The write enable signal is used in the control of a timing of the writing of the data into the data storage section 1. The serial data transfer control signal is used in the control of serial data transfer. The output enable signal is used in the control of outputting of the readout video data.

A serial port includes an input terminal 14 for a serial clock signal and an output terminal 15 for serial data. The terminals 14 and 15 are directly connected to the serial shift register 2. The serial clock signal is used in the serial reading of the video data from the serial shift register 2. The serial data read from the serial shift register 2 are outputted via the output terminal 15 to the CRT.

An input terminal 12 is subjected to a mode signal which determines the mode of operation of the video memory 30 as will be made clear later. The mode signal has one bit. An external 1-bit signal generator (not shown) produces the mode signal.

In general, most parts of figures or graphic pictures indicated by a display system are formed by straight lines. A straight line is represented by a group of equal point data. During the writing of data representing a straight line, equal data are written into a data storage section. Accordingly, it is desirable that equal data can be written into the data storage section at a high speed.

The video memory 30 of this embodiment can operate in either an image mode or a vector mode. In the image mode of operation, the mask data and the video data are directly inputted via the input/output terminal 7 and are written into the data storage section 1. The vector mode of operation uses vector data which are inputted via the input/output terminal 7 and which are contained in input data fed via the input/output terminal 7. The vector data represent a write start position and a write end position in respect of the writing of given-type data (for example, data representing a straight line) into the data storage section 1. The given-type data have an effective part corresponding to the length of a related straight line for example. The write start position and the write end position are distant from each other by a distance corresponding to the length of bit width of the effective part of the given-type data. The write start position denotes the bit of a word of the data storage section 1 into which a head of the effective part of the given-type data is written. The write end position denotes the bit of the word of the data storage section 1 into which an end of the effective part of the given-type data is written. The intermediate portions of the effective part of the given-type data are stored into respective bits between the write start position storing bit and the write end position storing bit of the word.

A mask data generator 3 connected to the input/output terminal 7 receives the vector data contained in the input data fed via the input/output terminal 7. The mask data generator 3 produces mask data in accordance with the write start position and the write end position represented by the vector data. The mask data generator 3 outputs the generated mask data to a selector 4. Mask data can be directly fed via the input/output terminal 7 to the selector 4. The selector 4 selects one of the mask data from the mask data generator 3 and the mask data from the input/output terminal 7 and feeds the selected mask data to the data storage section 1.

A data generator 20 connected to the input/output terminal 7 generates write data on the basis of a part of the input data fed via the input/output terminal 7. The write data generated by the data generator 20 are fed to a selector 5. Write data can be directly fed via the input /output terminal 7 to the selector 5. The selector 5 selects one of the write data from the data generator 20 and the write data from the input/output terminal 7 and feeds the selected data to the data storage section 1.

Control terminals of the selectors 4 and 5 are subjected to the mode signal fed via the input terminal 12. The data selections by the selectors 4 and 5 are controlled in response to the mode signal.

The data can be read out from the data storage section 1 via the input/output terminal 7. Specifically, the data read out from the data storage section 1 are transmitted to the input/output terminal 7 via a selector 23. The selector 23 is subjected to the address signal via the input terminal 6. The number of bits of the data read out from the data storage section 1 is greater than the number of bits of the input/output terminal 7. Accordingly, data of a bit number equal to the bit number of the input/output terminal 7 are made by the selector 23 from the readout data in response to a part of the address signal. The selector 23 can be a multiplexer.

A more detailed description will be given hereinafter in a typical case where the bit width (number) of the input/output terminal 7 corresponds to 16 bits while the bit width of the data written into the data storage section 1 corresponds to 32 bits (the data written into the data storage section has a parallel form with 32 bits).

Figure 2:
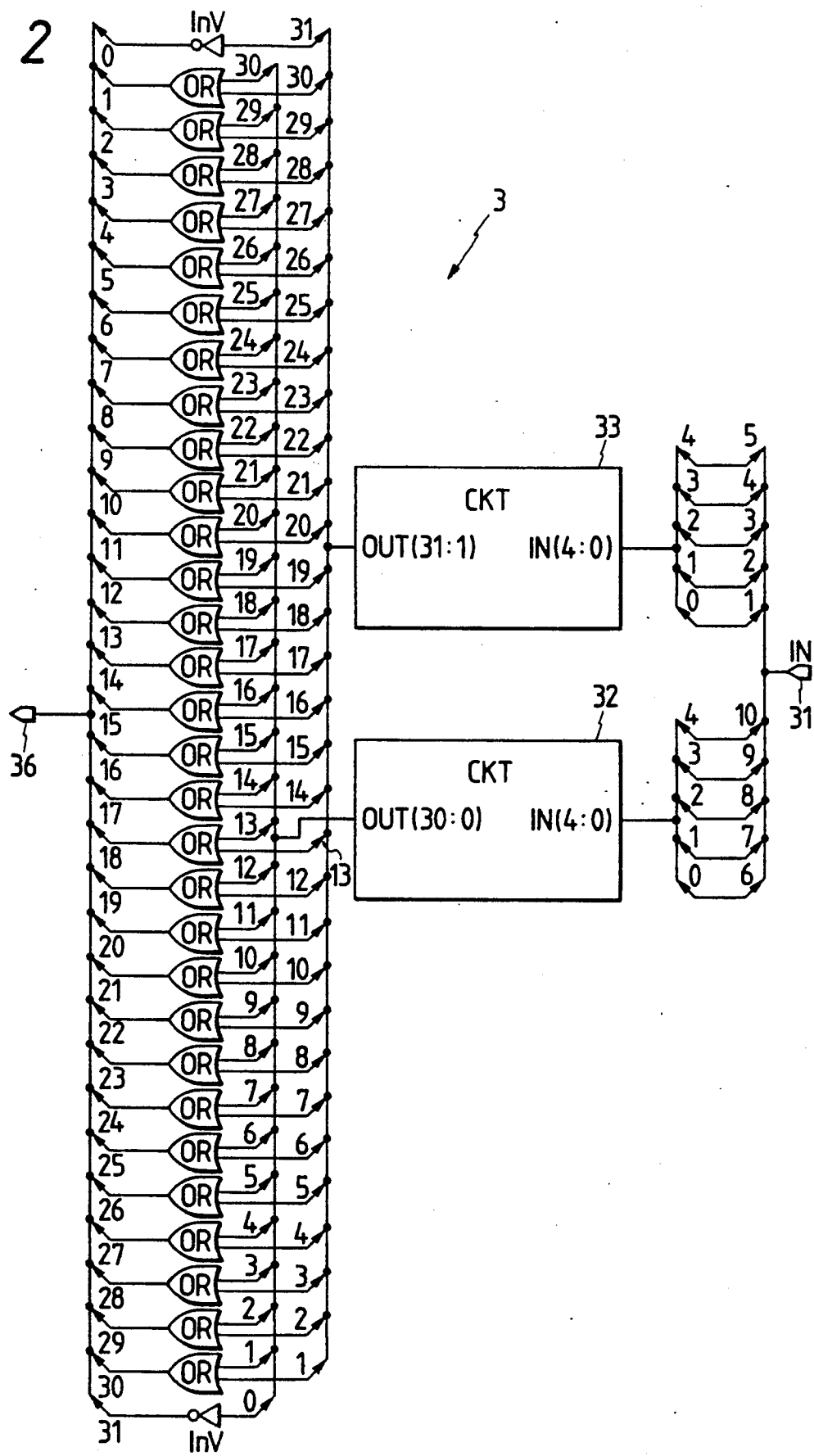
FIG. 2 is a block diagram of the mask data generator of FIG. 1.
Figure 3:
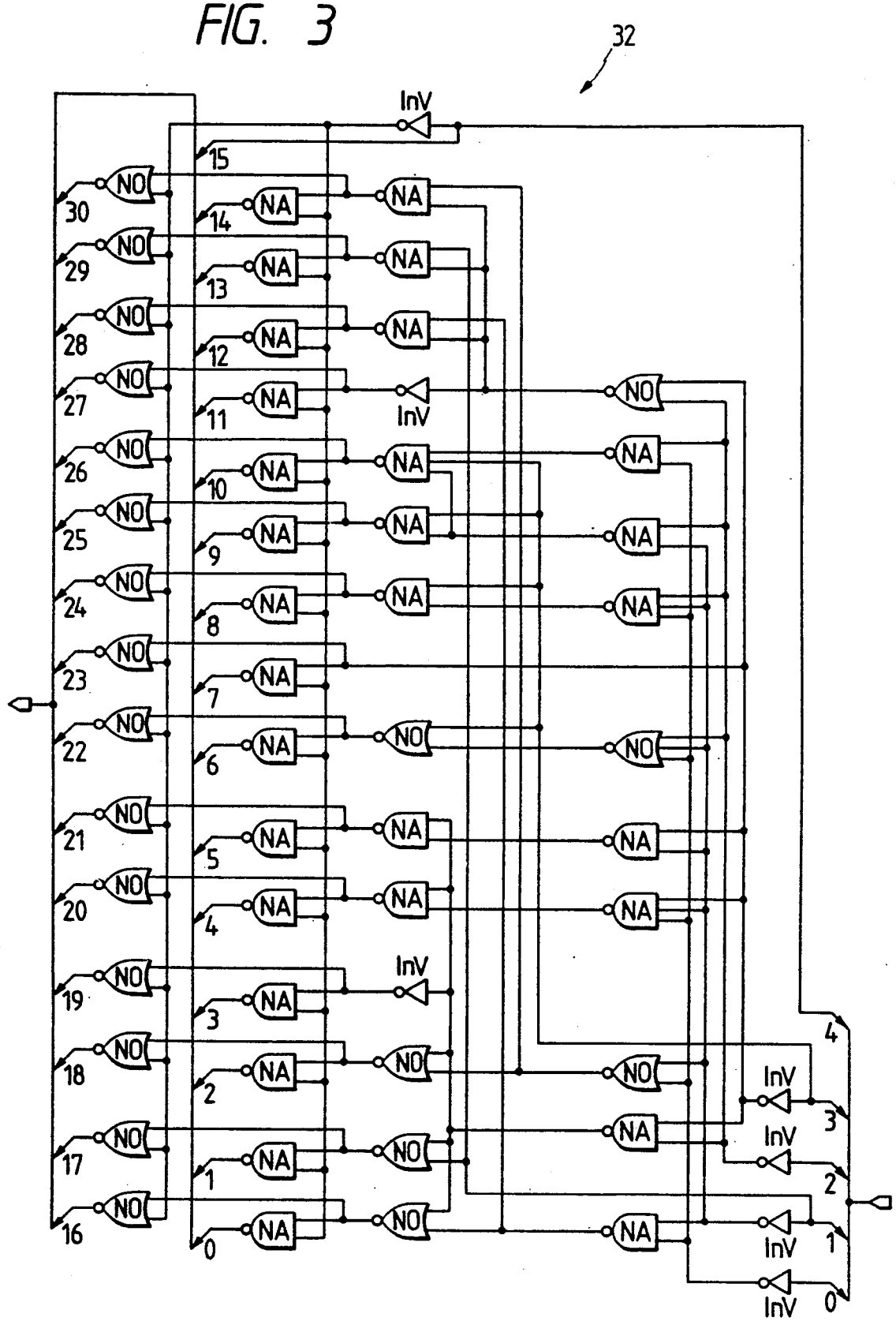
FIG. 3 is a block diagram of a segment of the mask data generator of FIG. 2.
Figure 4:
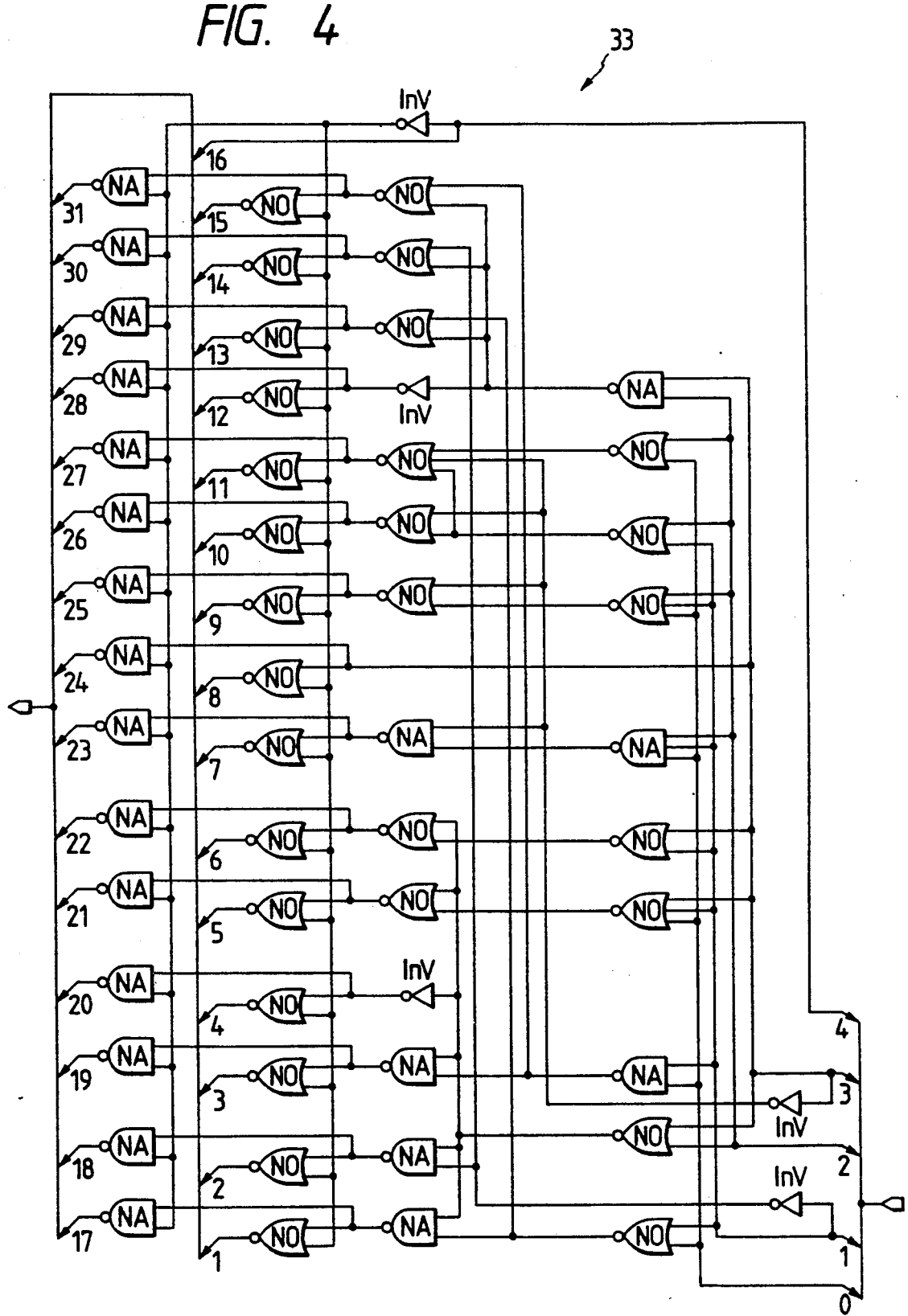
FIG. 4 is a block diagram of another segment of the mask data generator of FIG. 2.

The vector mode of operation of the video memory 30 will now be explained. As shown in FIG. 5(a), the input data fed via the input/output terminal 7 have 16 bits. The 10 lower bits of the input data denote vector data and are separated into a pair of 5-bit groups representing the write start position and the write end position respectively. In the example of FIG. 5(a), the write start position is "4" and the write end position is "28". As shown in FIG. 2, the mask data generator 3 includes circuits 32 and 33 subjected to the respective 5-bit parts of the vector data 31. The circuits 32 and 33 generate write start mask data and write end mask data in accordance with the write start position and the write end position represented by the vector data 31 respectively. As shown in FIG. 5(b), the write start mask data are separated into two parts, and all the bits in the former part are "1" and all the bits in the latter part are "0". The boundary between the two parts of the write start mask data corresponds to the write start position represented by the vector data (see FIG. 5(a)). As shown in FIG. 5(c), the write end mask data are separated into two parts, and all the bits in the former part are "0" and all the bits in the latter part are "1". The boundary between the two parts of the write end mask data corresponds to the write end position represented by the vector data (see FIG. 5(a)). As shown in FIG. 3, the circuit 32 is composed of a random logic circuit including inverters, NAND gates, and NOR gates. As shown in FIG. 4, the circuit 33 is composed of a random logic circuit including inverters, NAND gates, and NOR gates. In the mask data generator 3 of FIG. 2, an array of OR gates and inverters generates write mask data 36 (see FIG. 5(d)) on the basis of the write start mask data (see FIG. 5(b)) and the write end mask data (see FIG. 5(c)). The data generator 20 produces 32-bit data on the basis of a given part of the input data fed via the input/output terminal 7. As shown in FIG. 5(a), the highest or first bit of the input data represents write data. In the example of FIG. 5(a), the write data is "1". The data generator 20 produces 32-bit data (see FIG. 5(e)), all the bits of which agree with the write data represented by the input data (see FIG. 5(a)). In the example of FIG.

Figure 13:
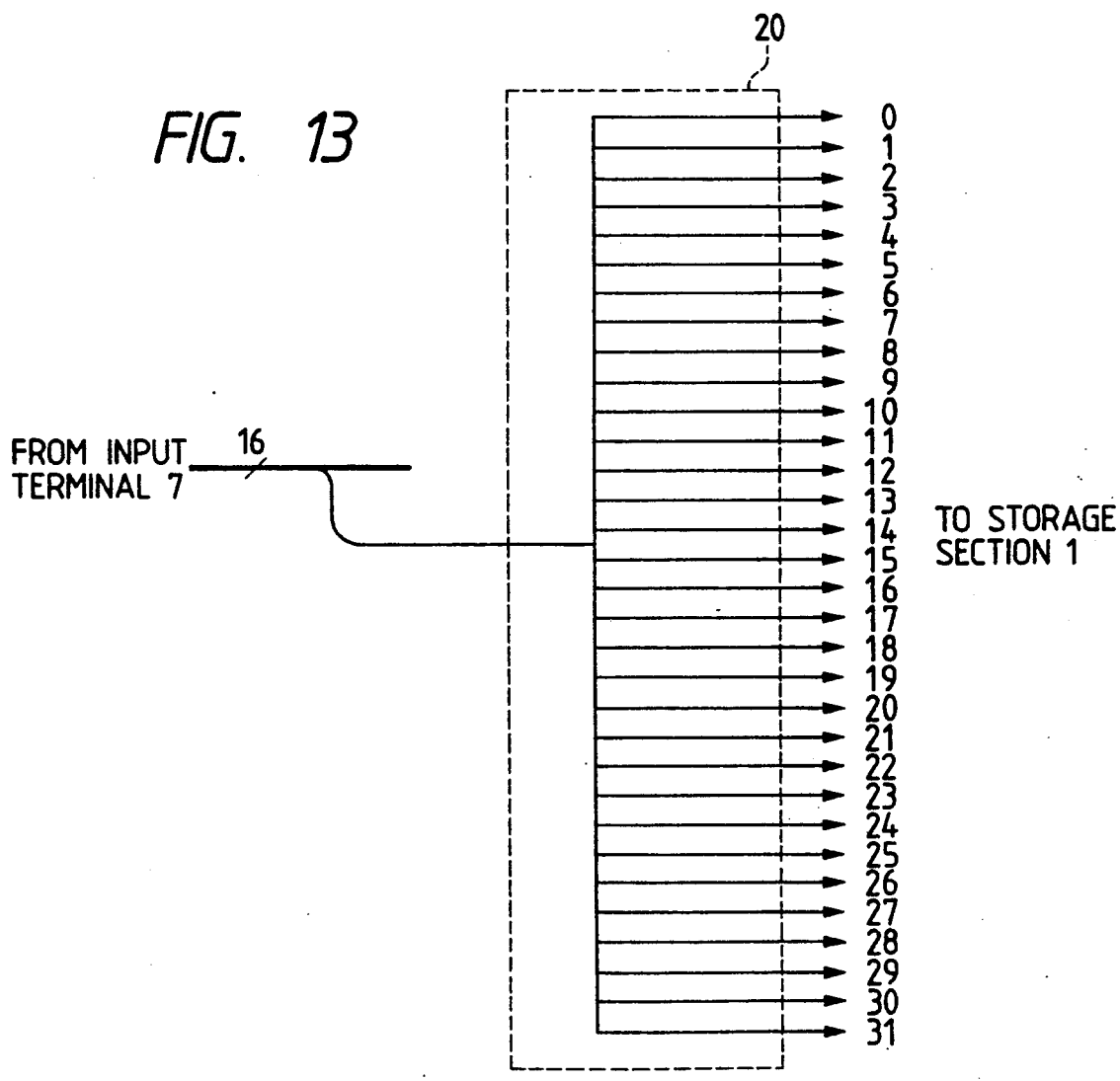
FIG. 13 is a diagram of the data generator of FIG. 1.

5(e), all the bits of the 32-bit write data produced by the data generator 20 are "1". As shown in FIG. 13, the data generator 20 includes a wiring arrangement which branches the highest bit of the input/output terminal 7 into 32-bit lines leading to the selector 5. The output data from the mask data generator 3 and the output data from the data generator 20 are selected by the selectors 4 and 5 in response to the mode signal supplied via the input terminal 12, and are thus fed to the data storage section 1. The data storage section 1 has a part which generates final write data on the basis of the write data and the mask data fed from the selectors 4 and 5. This part of the data storage section 1 has a known design. Accordingly, successively equal data (see FIG. 5(f)) are written into a region "A" within a 32-bit area of the data storage section 1. The size of the region "A" and the position of the region "A" relative to the 32-bit area are determined by the mask data (see FIG. 5(d) outputted from the mask data generator 3. The value of the data written into the region "A" is determined by the write data (see FIG. 5(e)) outputted from the data generator 20. In the example of FIG. 5(f), the value of the data written into the region "A" is "1". When the data are read out from the data storage section 1 and are indicated on the CRT, a straight line having a length corresponding to the size of the region "A" is drawn on the CRT.

Figure 7:
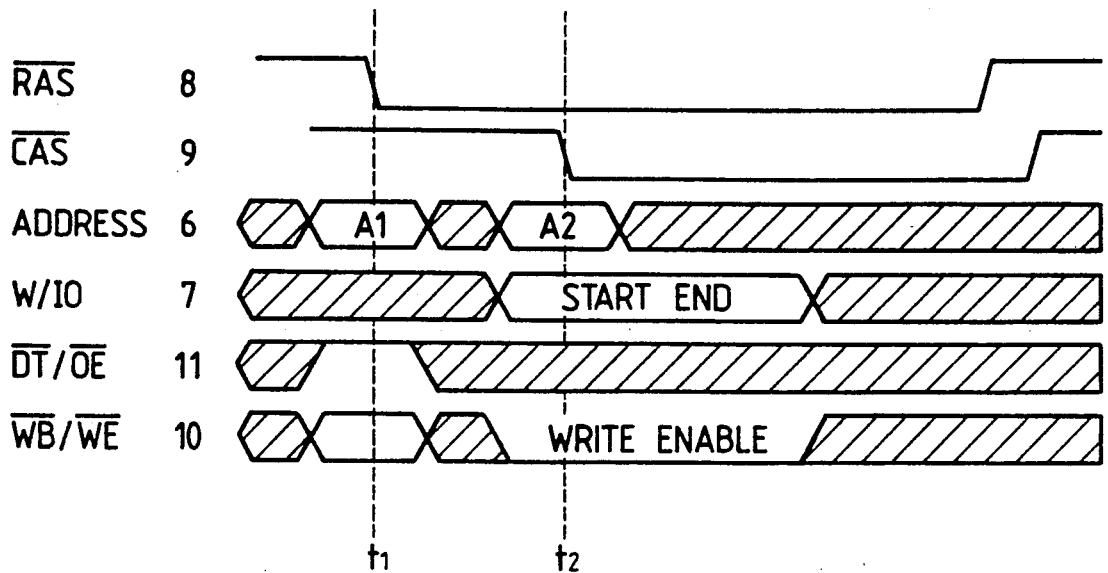
FIG. 7 is a timing diagram showing various signals which occur during the vector mode of operation of the video memory of FIG. 1.

The vector mode of operation of the video memory 30 will be further explained. As shown in FIG. 7, a row address A1 in the address signal is given at the timing t1 of the falling edge in the RAS signal. A column address A2 in the address signal is given at the timing of the falling edge of the CAS signal. A word of the data storage section 1 which will undergo data writing is selected in accordance with the given row address A1 and the given column address A2. The write start position data and the write end position data are fed to the input/output terminal 7 at the timing t2 of the falling edge of the CAS signal. The write mask control signal which enables the mask data is fed to the input terminal 10 at the timing t1 of the falling edge in the RAS signal. The write enable (WE) signal is fed to the input terminal 10 during the writing process. The mode signal fed via the input terminal 12 has a state which enables the writing operation in the vector mode.

The image mode of operation of the video memory 30 will now be explained. The selectors 4 and 5 select the input data directly fed via the input/output terminal 7 in response to the mode signal fed via the input terminal 12. When the 16-bit input data (see FIG. 6(a)) are fed to the selector 4 as 16-bit mask data, the selector 4 generates 32-bit mask data (see FIG. 6(c)) on the basis of the 16-bit mask data and the address signal fed via the input terminal 6. The 16 higher bits of the 32-bit mask data agree with the 16-bit mask data. The 16 lower bits of the 32-bit mask data have equal values determined by the content of a predetermined bit of the address signal. The 32-bit mask data are fed from the selector 4 to the data storage section 1. When the 16-bit input data (see FIG. 6(b)) are fed to the selector 5 as write data, the selector 5 generates 32-bit write data (see FIG. 6(d)) on the basis of the 16-bit write data through a duplicating process. The 16 higher bits and also the 16 lower bits agree with the 16-bit write data. The 32-bit write data are fed from the selector 5 to the data storage section 1. Parts of the 32-bit write data (see FIG. 6(d) are masked by the 32-bit mask data (see FIG. 6(c), and the resultant data (see FIG. 6(e) are written into the data storage section 1.

Figure 8:
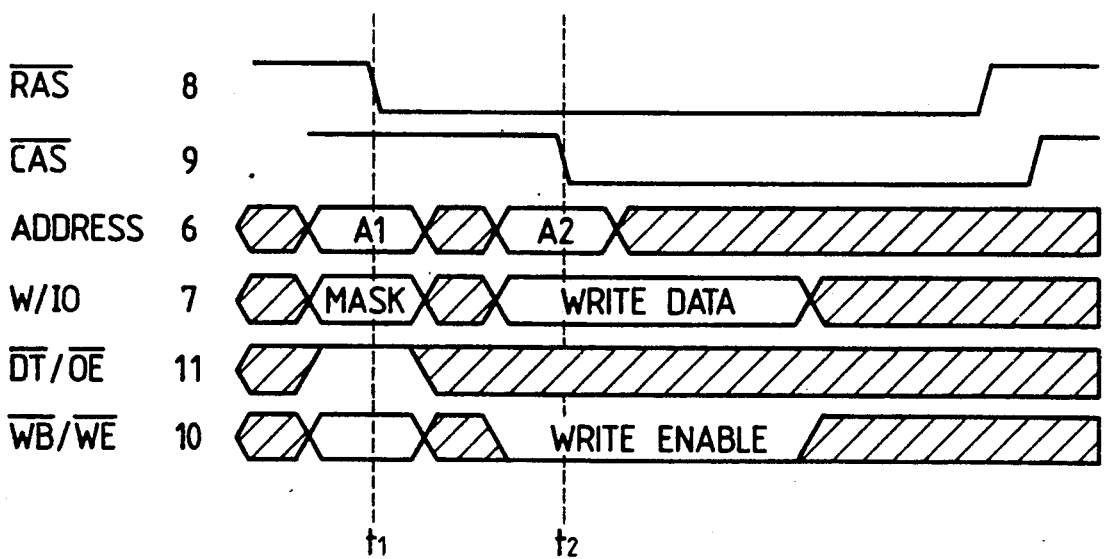
FIG. 8 is a timing diagram showing various signals which occur during the image mode of operation of the video memory of FIG. 1.

The image mode of operation of the video memory 30 will be further explained. As shown in FIG. 8, a row address A1 in the address signal is given at the timing t1 of the falling edge in the RAS signal. A column address A2 in the address signal is given at the timing of the falling edge of the CAS signal. A word of the data storage section 1 which will undergo data writing is selected in accordance with the given row address A1 and the given column address A2. The mask data are fed to the input/output terminal 7 at the timing t1 of the falling edge in the RAS signal. The write data are fed to the input/output terminal 7 at the timing t1 of the falling edge in the CAS signal. The write mask control signal which enables the mask data is fed to the input terminal 10 at the timing t1 of the falling edge in the RAS signal. The write enable (WE) signal is fed to the input terminal 10 during the writing process. The mode signal fed via the input terminal 12 has a state which enables the writing operation in the image mode.

The data can be read out from the data storage section 1 via the input/output terminal 7 as follows. A part of the data read out from the data storage section 1 is transmitted to the input/output terminal 7 via the selector 23. The selector 23 is subjected to the address signal via the input terminal 6. The number of bits of the data read out from the data storage section 1 is 32 while the number of bits of the input/output terminal 7 is 16. Accordingly, data of a bit number equal to the bit number of the input/output terminal 7 are made by the selector 23 from the readout data in response to a part of the address signal. Specifically, the selector 23 selects the 16 higher bits or the 16 lower bits of the readout data in response to a given bit of the address signal, and transmits the selected 16-bit data to the input/output terminal 7.

Figure 12:
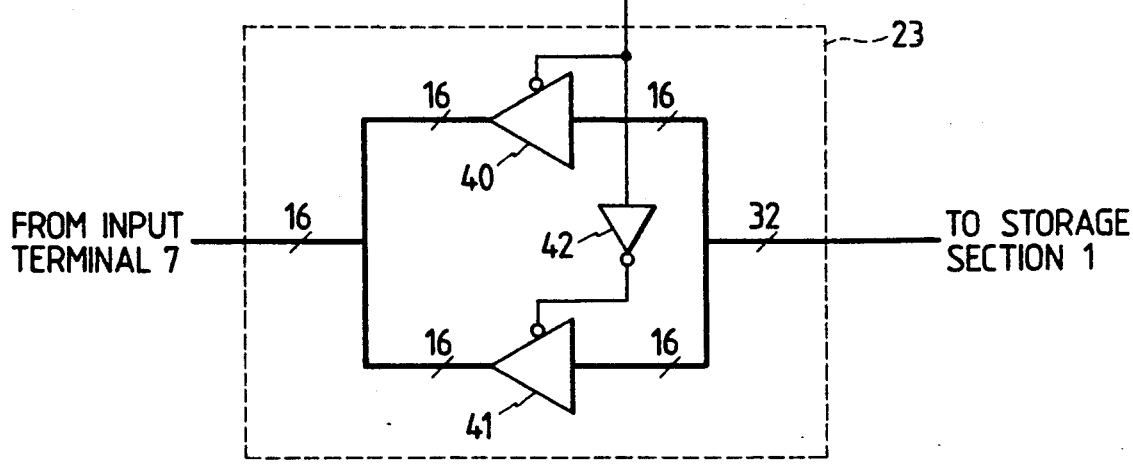
FIG. 12 is a block diagram of a first selector of the video memory of FIG. 1.

As shown in FIG. 12, the selector 23 includes switching buffers 40 and 41. Respective input terminals of the switching buffer 40 receive the 16 higher bits of data read out from the data storage section 1. Respective input terminals of the switching buffer 41 receive the 16 lower bits of the readout data. Output terminals of the switching buffers 40 and 41 are connected to the input/output terminal 7. A given bit of the address signal inputted via the terminal 6 is applied to a control terminal of the switching buffer 40. The given bit of the address signal is applied to a control terminal of the switching buffer 41 via an inverter 42. One of the switching buffers 40 and 41 is made conductive and the other is made non-conductive in response to the state of the given bit of the address signal, and the 16 higher bits or the 16 lower bits of the readout data are transmitted through the conductive one of the switching buffers 40 and 41 to the input/output terminal 7.

Figure 14:
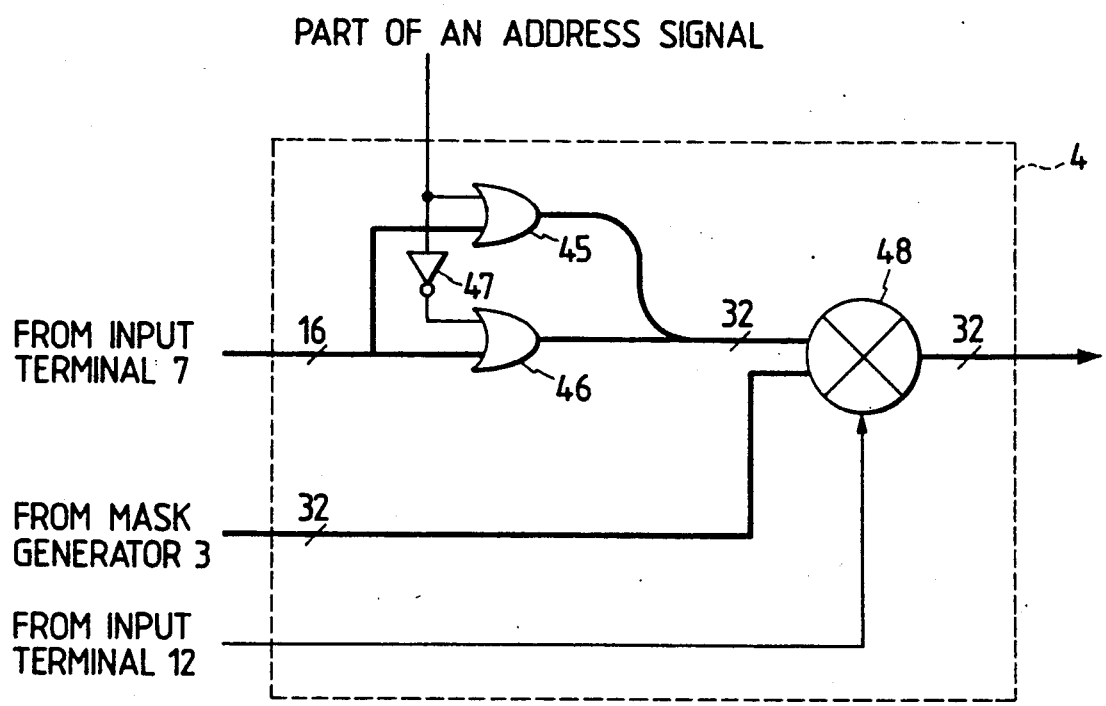
FIG. 14 is a block diagram of a second selector of the video memory of FIG. 1.

FIG. 14 shows an internal design of the selector 4. The selector 4 includes a first set 45 of 16 OR gates and a second set 46 of 16 OR gates. First input terminals of the OR gate set 45 are connected to the respective bits of the input/output terminal 7. Second input terminals of the OR gate set 45 are subjected to a given bit of the address signal fed via the input terminal 6. The OR gate set 45 generates the 16 higher bits of 32-bit mask data on the basis of the 16-bit input data fed via the input/output terminal 7 and on the basis of the given bit of the address signal. Similarly, first input terminals of the OR gate set 46 are connected to the respective bits of the input/output terminal 7. Second input terminals of the OR gate set 46 are subjected to the output signal from an inverter 47 which agrees with the inversion of the given bit of the address signal. The OR gate set 46 generates the 16 lower bits of the 32-bit mask data on the basis of the 16-bit input data and the inversion of the given bit of the address signal. One of halves of the 32-bit mask data generated by the OR gate sets 45 and 46 agrees with the 16-bit input data while the other is set to "1" in each bit. The 32-bit mask data are outputted from the OR gate sets 45 and 46 to a multiplexer 48. Other 32-bit mask data are fed to the multiplexer 48 from the mask data generator 3. The multiplexer 48 selects one of the two 32-bit mask data in accordance with the mode signal fed via the input terminal 12. Specifically, when the mode signal designates the vector mode of operation, the multiplier 48 selects the 32-bit mask data fed from the mask data generator 3. When the mode signal designates the image mode of operation, the multiplier 48 selects the 32-bit mask data fed from the OR gate sets 45 and 46. The selected 32-bit mask data are outputted from the multiplexer 48 to the data storage section 1.

Figure 15:
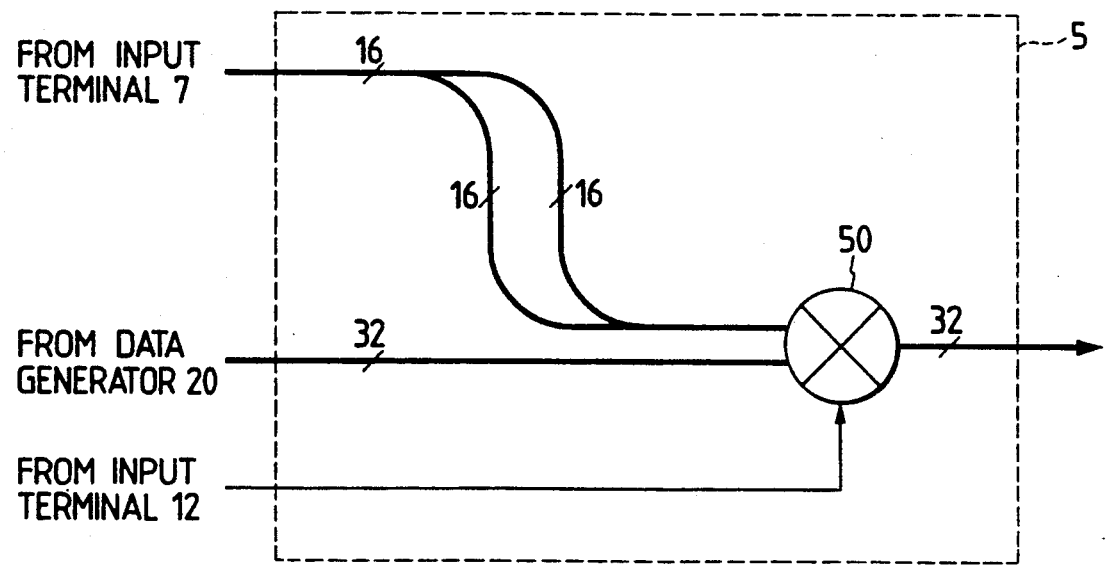
FIG. 15 is a block diagram of a third selector of the video memory of FIG. 1.

FIG. 15 shows an internal design of the selector 5. The selector 5 includes a branch circuit which generates 32-bit write data on the basis of the 16-bit write data fed via the input/output terminal 7. The 16 higher bits and also the 16 lower bits of the 32-bit write data agree with the 16-bit write data. The 32-bit write data are fed from the branch circuit to a multiplexer 50. Other 32-bit write data are fed to the multiplexer 50 from the data generator 20. The multiplexer 50 selects one of the two 32-bit write data in accordance with the mode signal fed via the input terminal 12. Specifically, when the mode signal designates the vector mode of operation, the multiplier 50 selects the 32-bit write data fed from the data generator 20. When the mode signal designates the image mode of operation, the multiplier 50 selects the 32-bit write data fed from the branch circuit. The selected 32-bit write data are outputted from the multiplexer 50 to the data storage section 1.

DESCRIPTION OF THE SECOND PREFERRED EMBODIMENT

Figure 9:
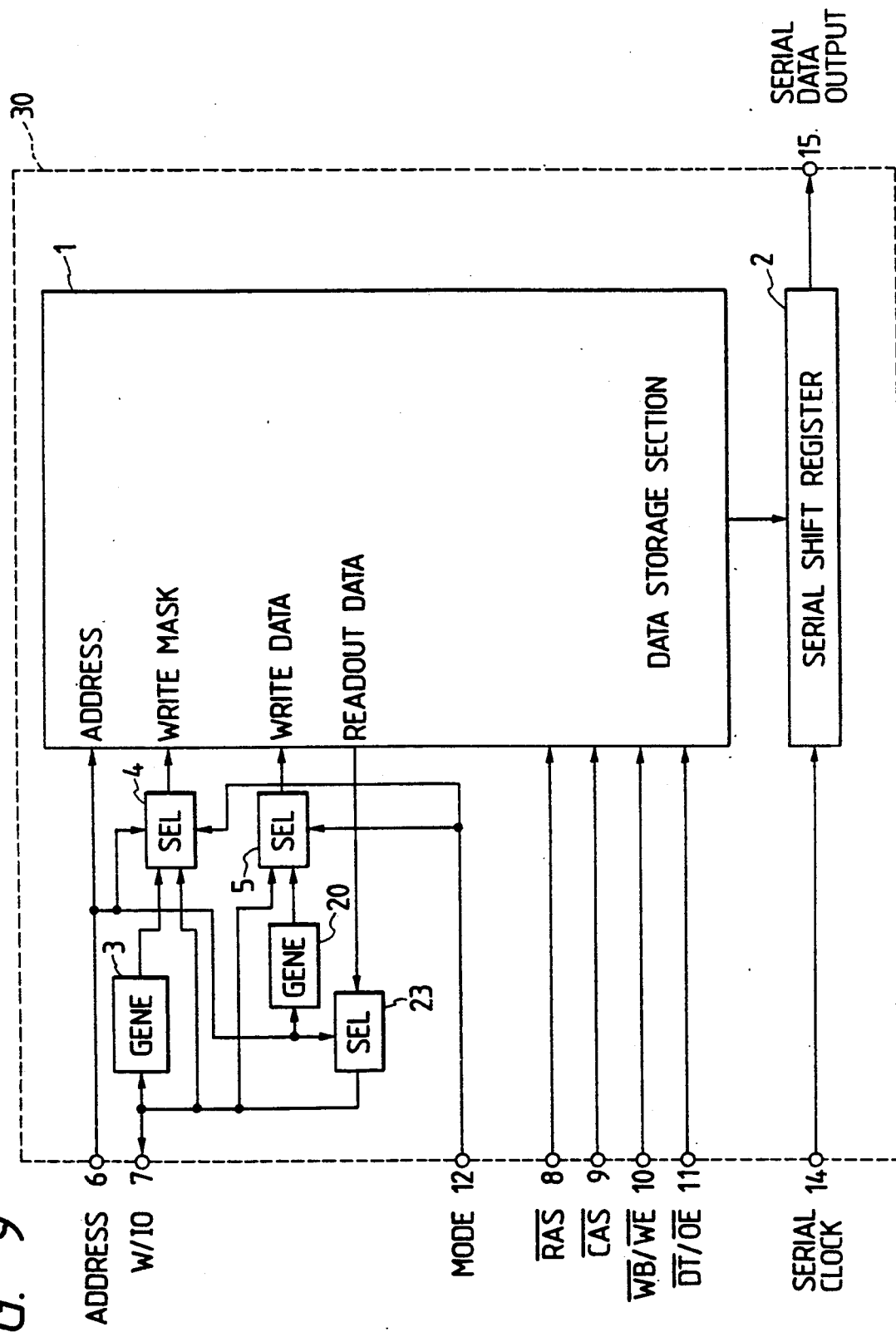
FIG. 9 is a block diagram of a video memory according to a second embodiment of this invention.

FIG. 9 shows a second embodiment of this invention which is similar to the embodiment of FIGS. 1-8 except that a data generator 20 produces 32-bit write data on the basis of a given part of the address signal. Specifically, an unused bit of the address signal feeds the data "1" or "0" to the data generator 20, and the data generator 20 produces the 32-bit write data on the basis of the single-bit data "1" or "0".

DESCRIPTION OF THE THIRD PREFERRED EMBODIMENT

FIG. 10 shows a third embodiment of this invention which is similar to the embodiment of FIGS. 1-8 except for design changes indicated hereinafter.

In the embodiment of FIG. 10, a logic operation circuit 24 executes a logic operation between write data outputted from a selector 5 and previously-stored write data fed from a data storage section 1, and thereby generates current write data. The current write data are fed from the logic operation circuit 24 to the data storage section 1. The logic operation by the logic operation circuit 24 is changeable among various types. In cases where the write data outputted from the selector 5 are referred to as a source while the previously-stored write data fed from the data storage section 1 are referred to as a destination, the logic operation by the logic operation circuit 24 can change among an operation of selecting the source, an operation of selecting the destination, a set operation, a clear operation, and AND operation between the source and the destination, an EXCLUSIVE-OR operation between the source and the destination, and others. The logic operation by the logic operation circuit 24 is changed in response to a part of an address signal fed via an input terminal 6.

A data generator 25 outputs 32-bit write data, all the bits of which are "1", to the selector 5. Write data are also fed to the selector 5 via an input/output terminal 7. During a vector mode of operation, the selector 5 selects the write data from the data generator 25 in response to a mode signal fed via an input terminal 12 and outputs the selected data to the logic operation circuit 24.

Figure 11A:
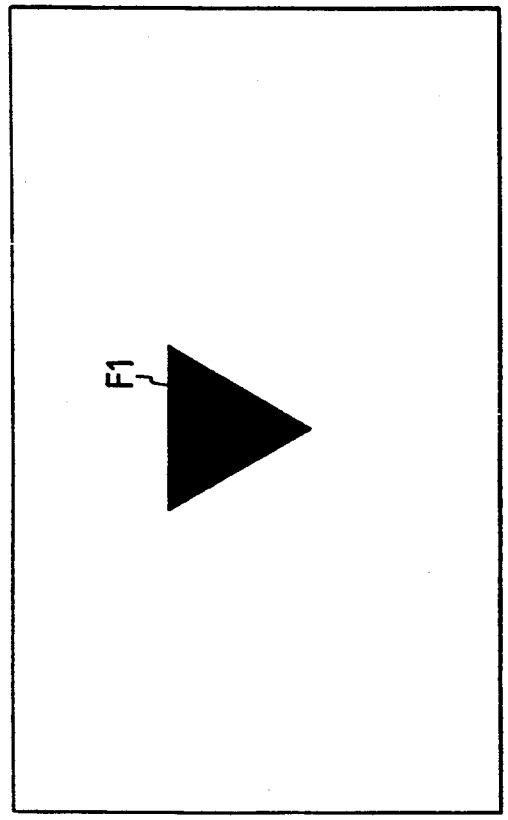
FIGS. 11a-h is a diagram showing various figures generated through the processing of data in the video memory of FIG. 10.
Figure 11B:
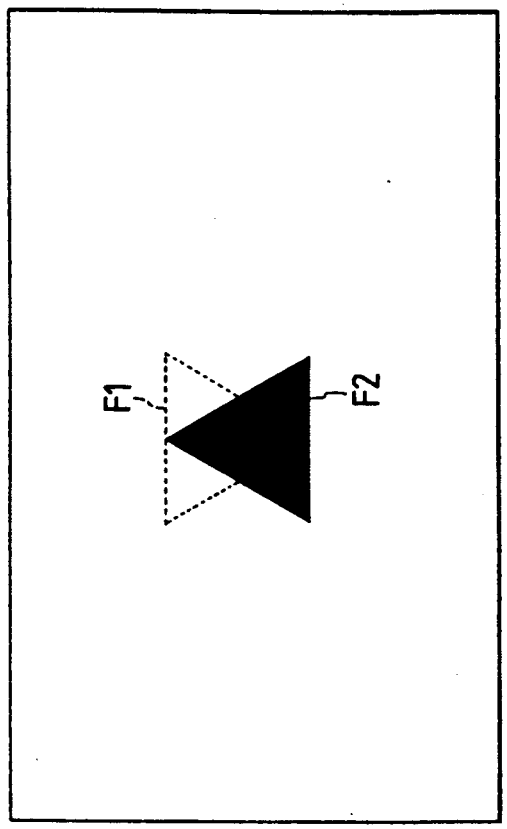
Figures 11C, 11D, 11E, 11F, 11G, 11H:
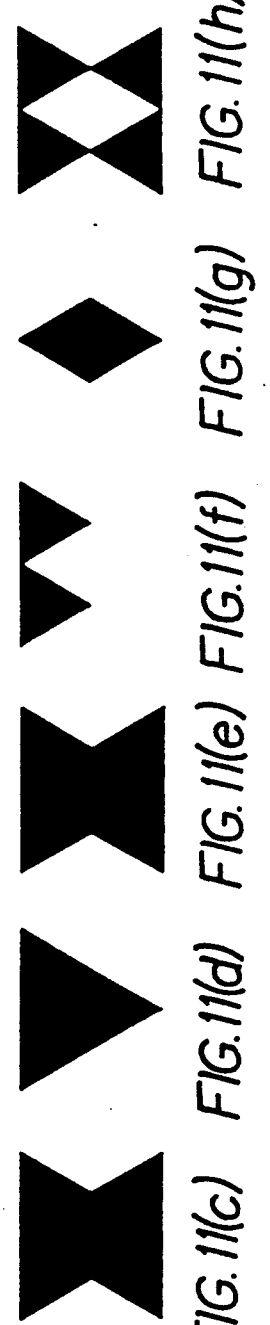

It is now assumed that the previously-stored write data fed to the logic operation circuit 24 from the data storage section 1 represent a triangle F1 shown in the parts (a) and (b) of FIG. 11 and the write data fed to the logic operation circuit 24 from the selector 5 represents a triangle F2 shown in the part (b) of FIG. 11. As described previously, the logic operation circuit 24 generates new write data on the basis of the previously-stored write data fed from the data storage section 1 and the write data fed from the selector 5. The new write data generated by the logic operation circuit 24 change in accordance with the type of the logic operation executed by the logic operation circuit 24. The new write data are written into the data storage section 1. When the logic operation executed by the logic operation circuit 24 agrees with the operation of selecting the source, the new write data generated by the logic operation circuit 24 are equal to the write data fed from the selector 5 so that the data of the triangle F2 are written over the data of the triangle F1 and the resultant stored data in the data storage section 1 represent a figure shown in the part (c) of FIG. 11. When the logic operation agrees with the operation of selecting the destination, the new write data are equal to the previously-stored write data fed from the data storage section 1 so that the data stored in the data storage section 1 remain unchanged and represent a figure shown in the part (d) of FIG. 11. When the logic operation agrees with the set operation, the new write data are equal to the write data fed from the selector 5 so that the data of the triangle F2 are written over the data of the triangle F1 and the resultant stored data in the data storage section 1 represent a figure shown in the part (e) of FIG. 11. When the logic operation agrees with the clear operation, the new write data are equal to an inversion of the write data fed from the selector 5 so that an inversion of the data of the triangle F2 are written over the data of the triangle F1 and the resultant stored data in the data storage section 1 represent a figure shown in the part (f) of FIG. 11. When the logic operation agrees with the AND operation, the resultant stored data in the data storage section 1 represent a figure shown in the part (g) of FIG. 11. When the logic operation agrees with the EXCLUSIVE-OR operation, the resultant stored data in the data storage section 1 represent a figure shown in the part (h) of FIG. 11.

It should be noted that the data generator 25 may output 32-bit write data, all the bits of which are "0".

What is claimed is:

1. A video memory comprising:
   a data storage section having a predetermined bit width of data writing and reading;

a data input terminal having a predetermined bit width and being subjected to input data which represents a write start position and a write end position;

means for generating mask data on the basis of the write start position and the write end position represented by the input data, and for feeding the mask data to the data storage section; and means for generating write data on the basis of at least part of an input signal, and for feeding the write data to the data storage section;

wherein the bit width of data writing and reading of the data storage section is greater than the bit width of the data input terminal.

2. A video memory comprising:

a data storage section having a predetermined bit width of data writing and reading;

a data input terminal having a predetermined bit width and being subjected to input data which represents a write start position, a write end position, primary mask data, and primary write data;

means for generating first mask data on the basis of the write start position and the write end position represented by the input data;

means for generating second mask data on the basis of the primary mask data represented by the input data;

first selecting means for selecting one of the first mask data and the second mask data, and for feeding the selected one of the first mask data and the second mask data to the data storage section;

means for generating first write data on the basis of a part of the input data;

means for generating second write data on the basis of the primary write data represented by the input data; and second selecting means for selecting one of the first write data and the second write data, and for feeding the selected one of the first write data and the second write data to the data storage section;

wherein the bit width of data writing and reading of the data storage section is greater than the bit width of the data input terminal.

3. The video memory of claim 2 wherein the first selecting means and the second selecting means are controlled by a common mode control signal.

4. A video memory comprising:

a data storage section having a predetermined bit width of data writing and reading;

a data input terminal having a predetermined bit width and being subjected to input data which represents a write start position, a write end position, primary mask data, and primary write data;

means for generating first mask data on the basis of the write start position and the write end position represented by the input data;

means for generating second mask data on the basis of the primary mask data represented by the input data;

first selecting means for selecting one of the first mask data and the second mask data, and for feeding the selected one of the first mask data and the second mask data to the data storage section;

means for generating first write data on the basis of a content of a predetermined bit of the input data;

means for generating second write data on the basis of the primary write data represented by the input data; and second selecting means for selecting one of the first write data and the second write data, and for feeding the selected one of the first write data and the second write data to the data storage section;

wherein the bit width of data writing and reading of the data storage section is greater than the bit width of the data input terminal.

5. The video memory of claim 4 wherein the first selecting means and the second selecting means are controlled by a common mode control signal.

6. A video memory comprising:

a data storage section having a predetermined bit width of data writing and reading;

a data input terminal having a predetermined bit width and being subjected to input data which represents a write start position, a write end position, primary mask data, and primary write data;

means for generating first mask data on the basis of the write start position and the write end position represented by the input data;

means for generating second mask data on the basis of the primary mask data represented by the input data;

first selecting means for selecting one of the first mask data and the second mask data, and for feeding the selected one of the first mask data and the second mask data to the data storage section;

means for generating first write data on the basis of a content of a predetermined bit of an address signal;

means for generating second write data on the basis of the primary write data represented by the input data; and second selecting means for selecting one of the first write data and the second write data, and for feeding the selected one of the first write data and the second write data to the data storage section;

wherein the bit width of data writing and reading of the data storage section is greater than the bit width of the data input terminal.

7. The video memory of claim 6 wherein the first selecting means and the second selecting means are controlled by a common mode control signal.

8. A video memory comprising:

a data storage section having a predetermined bit width of data writing and reading;

a data input terminal having a predetermined bit width and being subjected to input data which represents a write start position, a write end position, primary mask data, and primary write data;

means for generating first mask data on the basis of the write start position and the write end position represented by the input data;

means for generating second mask data on the basis of the primary mask data represented by the input data;

first selecting means for selecting one of the first mask data and the second mask data, and for feeding the selected one of the first mask data and the second mask data to the data storage section;

means for generating first write data;

means for generating second write data on the basis of the primary write data represented by the input data; and second selecting means for selecting one of the first write data and the second write data, and for feeding the selected one of the first write data and the second write data to the data storage section;

wherein the bit width of data writing and reading of the data storage section is greater than the bit width of the data input terminal.

9. The video memory of claim 8 wherein the first selecting means and the second selecting means are controlled by a common mode control signal.

10. The video memory of claim 8 wherein all bits of the first write data are "1".

11. A video memory comprising:
a data storage section having a predetermined bit width of data writing and reading;
a data input terminal having a predetermined bit width and being subjected to input data which represents a write start position, a write end position, primary mask data, and primary write data;
means for generating first mask data on the basis of the write start position and the write end position represented by the input data;
means for generating second mask data on the basis of the primary mask data represented by the input data;
first selecting means for selecting one of the first mask data and the second mask data, and for feeding the selected one of the first mask data and the second mask data to the data storage section;
means for generating first write data;
means for generating second write data on the basis of the primary write data represented by the input data;
second selecting means for selecting one of the first write data and the second write data, and for outputting the selected one of the first write data and the second write data; and
means for executing a logic operation between the output data from the second selecting means and data read out from the data storage section, for generating third write data corresponding to a resultant of the logic operation, and for feeding the third write data to the data storage section;
wherein the bit width of data writing and reading of the data storage section is greater than the bit width of the data input terminal.

12. The video memory of claim 11 wherein the first selecting means and the second selecting means are controlled by a common mode control signal.

13. The video memory of claim 11 wherein all bits of the first write data are "1".

14. The video memory of claim 11 wherein the logic-operation executing means comprises means for changing the logic operation in accordance with a part of an address signal.

15. A video memory comprising:
a data storage section exposed to a writing of parallel data with a first predetermined number of bits;
means for receiving input parallel data representing a write start position and a write end position, the input parallel data having a second predetermined number of bits which is smaller than the first predetermined number of bits;
means for generating mask parallel data on the basis of the write start position and the write end position represented by the input data, the mask data having a predetermined number of bits which equals the first predetermined number of bits;
means for feeding the mask data to the data storage section;

means for generating write parallel data having a predetermined number of bits which equals the first predetermined number of bits; and
means for feeding the write data to the data storage section.

16. A video memory comprising:
a data storage section exposed to a writing of parallel data with a first predetermined number of bits;
means for receiving input parallel data representing a write start position and a write end position, the input parallel data having a second predetermined number of bits which is smaller than the first predetermined number of bits, the input parallel data also representing primary mask data and primary write data;
means for generating first mask parallel data on the basis of the write start position and the write end position represented by the input data, the first mask data having a predetermined number of bits which equals the first predetermined number of bits;
means for generating second mask parallel data on the basis of the primary mask data represented by the input data, the second mask data having a predetermined number of bits which equals the first predetermined number of bits;
means for selecting one of the first mask data and the second mask data, and for feeding the selected one of the first mask data and the second mask data to the data storage section;
means for generating first write parallel data having a predetermined number of bits which equals the first predetermined number of bits;
means for generating second write parallel data on the basis of the primary write data represented by the input data, the second write data having a predetermined number of bits which equals the first predetermined number of bits; and
means for selecting one of the first write data and the second write data, and for feeding the selected one of the first write data and the second write data to the data storage section.

17. A video memory comprising:
a data storage section exposed to a writing and a reading of parallel data with a first predetermined number of bits;
means for receiving input parallel data representing a write start position and a write end position, the input parallel data having a second predetermined number of bits which is smaller than the first predetermined number of bits, the input parallel data also representing primary mask data and primary write data;
means for generating first mask parallel data on the basis of the write start position and the write end position represented by the input data, the first mask data having a predetermined number of bits which equals the first predetermined number of bits;
means for generating second mask parallel data on the basis of the primary mask data represented by the input data, the second mask data having a predetermined number of bits which equals the first predetermined number of bits;
first selecting means for selecting one of the first mask data and the second mask data, and for feeding the selected one of the first mask data and the second mask data to the data storage section;

means for generating first write parallel data having a predetermined number of bits which equals the first predetermined number of bits;

means for generating second write parallel data on the basis of the primary write data represented by the input data, the second write data having a predetermined number of bits which equals the first predetermined number of bits;

second selecting means for selecting one of the first write data and the second write data, and for outputting the selected one of the first write data and the second write data; and means for executing a logic operation between the output data from the second selecting means and parallel data read out from the data storage section, for generating third write parallel data corresponding to a resultant of the logic operation, and for feeding the third write data to the data storage section, the third write data having a predetermined number of bits which equals the first predetermined number of bits.

18. A video memory comprising:

a data storage section having a predetermined bit width of data writing and reading;

a data input terminal having a predetermined bit width and being subjected to input data which represents a write start position and a write end position;

means for generating mask data on the basis of the write start position and the write end position represented by the input data, and for feeding the mask data to the data storage section; and means for generating write data, and for feeding the write data to the data storage section;

wherein the bit width of data writing and reading of the data storage section is greater than the bit width of the data input terminal.

* * * * *